US007261980B1

(12) United States Patent
Shoki

(10) Patent No.: US 7,261,980 B1
(45) Date of Patent: Aug. 28, 2007

(54) X-RAY MASK BLANK AND X-RAY MASK

(75) Inventor: Tsutomu Shoki, Hachioji (JP)

(73) Assignee: Hoya Corporation (JP)

( * ) Notice: Subject to any disclaimer, the term of this patent is extended or adjusted under 35 U.S.C. 154(b) by 0 days.

(21) Appl. No.: 09/052,670

(22) Filed: Mar. 31, 1998

(30) Foreign Application Priority Data

Mar. 31, 1997 (JP) .................................. 9-080762

(51) Int. Cl.
*G03F 9/00* (2006.01)
(52) U.S. Cl. ............................................ 430/5; 378/35
(58) Field of Classification Search .................... 430/5; 378/35, 34; 428/432
See application file for complete search history.

(56) References Cited

U.S. PATENT DOCUMENTS 5,005,075 A    4/1991    Kobayashi et al. ........... 378/35
5,178,977 A    1/1993    Yamada et al. ............... 378/35

FOREIGN PATENT DOCUMENTS

JP    7-75219    8/1995

OTHER PUBLICATIONS

English language abstract: Japanese Laid-Open Patent No. 7-75219, Aug. 1995.
Yamaguchi, Y.I. et al, "Properties of SiC Film as X-Ray Mask Membrane," Materials Research Laboratory, Hoya Corporation, pp. 197-210, 1993.

Primary Examiner—S. Rosasco
(74) Attorney, Agent, or Firm—Cook, Alex, McFarron, Manzo, Cummings & Mehler, Ltd.

(57) ABSTRACT

An x-ray mask blank and an x-ray mask wherein, assuming that $Ra_{max}$ and $Ra_{min}$ are defined as a maximum value of Ra and a minimum value of Ra of a surface roughness (Ra: center-line average roughness) on a plurality of points within a predetermined area on an x-ray membrane 12, respectively, the surface of the x-ray membrane 12 has a surface condition so that it may satisfy an expression: $(Ra_{max}-Ra_{min})/(Ra_{max}+Ra_{min}) \leq 0.15$.

5 Claims, 3 Drawing Sheets

|  | DISTRIBUTION VALUE OF SURFACE ROUGHNESS OF X-RAY MENBRANE | AVERAGE OF SURFACE ROUGHNESS OF X-RAY MENBRANE (nmRa) | STRESS DISTRIBUTION OF X-RAY ABSORBING FILM (×MPa) | POSITION PRECISION 3 σ (nm) |
|---|---|---|---|---|
| EMBODIMENT 1 | 0.05 | 0.35 | 0 ± 4 | 18 |
| EMBODIMENT 2 | 0.08 | 0.70 | 0 ± 5 | 15 |
| EMBODIMENT 3 | 0.12 | 0.85 | 0 ± 6 | 20 |
| EMBODIMENT 4 | 0.25 | 0.43 | 0 ± 15 | 35 |

1 X-RAY MASK

2 X-RAY MASK BLANK

FIG. 4

| | DISTRIBUTION VALUE OF SURFACE ROUGHNESS OF X-RAY MENBRANE | AVERAGE OF SURFACE ROUGHNESS OF X-RAY MENBRANE (nmRa) | STRESS DISTRIBUTION OF X-RAY ABSORBING FILM (×MPa) | POSITION PRECISION $3\sigma$ (nm) |
|---|---|---|---|---|
| EMBODIMENT 1 | 0.05 | 0.35 | 0±4 | 18 |
| EMBODIMENT 2 | 0.08 | 0.70 | 0±5 | 15 |
| EMBODIMENT 3 | 0.12 | 0.85 | 0±6 | 20 |
| EMBODIMENT 4 | 0.25 | 0.43 | 0±15 | 35 |

100
X-RAY MASK BLANK AND X-RAY MASK

REFERENCE TO RELATED APPLICATION

This application claims the priority right under 35 U.S.C 119, of Japanese Patent Application No. Hei 09-80762 filed on Mar. 31, 1997, the entire disclosure of which is incorporated herein by reference.

BACKGROUND OF THE INVENTION

1. Field of the Invention

The present invention relates to an x-ray mask for use in an x-ray lithography method and an x-ray mask blank which is part of the x-ray mask.

2. Description of the Related Art

In the semiconductor industry, the technique of forming an integrated circuit constituted of a fine pattern on a silicon substrate or the like using a photolithography method for transferring the fine pattern by the use of a visible light and an ultraviolet light as an exposing electromagnetic wave, is well known. However, a recent advance in semiconductor technique greatly promotes the high integration of a semiconductor device such as a VLSI. This results in a requirement for the technique for transferring the fine pattern of high accuracy beyond the transfer limit (a principled limit due to wavelength) of the visible light and the ultraviolet light used in the conventional photolithography method. In order to transfer such a fine pattern, an x-ray lithography method, using an x-ray whose wavelength is shorter than the wavelength of the visible light and the ultraviolet light, is attempted.

FIG. 1 is a cross sectional view showing a structure of an x-ray mask for use in the x-ray lithography. FIG. 2 is a cross sectional view showing the structure of an example of an x-ray mask blank as an intermediate product obtained in an intermediate step during manufacturing the x-ray mask.

As shown in FIG. 1, an x-ray mask 1 comprises an x-ray membrane 12 for transmitting the x-ray and an x-ray absorbing film pattern 13a formed on the x-ray membrane 12. The x-ray membrane 12 is supported by a silicon frame body 11a which is formed by removing a portion so that the periphery alone of the silicon substrate may remain. When this x-ray mask 1 is manufactured, the x-ray mask blank intermediate product is manufactured in the intermediate step. This x-ray mask blank is further processed, so that the x-ray mask is obtained. In this industry, while, the x-ray mask is a finished product which is dealt the x-ray mask blank, which is the intermediate product, is also often independently dealt.

As shown in FIG. 2, an x-ray mask blank 2 comprises the x-ray membrane 12 formed on a silicon substrate 11 and an x-ray absorbing film 13 formed on the x-ray membrane 12.

Silicon nitride, silicon carbide, diamond or the like is generally used as the x-ray membrane 12. An amorphous material, including tantalum (Ta), having an excellent resistance to x-ray radiation, is often used as the x-ray absorbing film 13.

One example of a process of manufacturing the x-ray mask 1 from the x-ray mask blank 2, is the following example. A resist film on which a desired pattern is formed is arranged on the x-ray mask blank 2 shown in FIG. 2. This pattern is then used as a mask so as to perform a dry etching, so that the x-ray absorbing film pattern is formed. After that, a center area, formed on a rear surface and to be a window area of the x-ray membrane 12, is removed by a reactive ion etching (RIE) using 4-fluorocarbon ($CF_4$) as etching gas.

The remaining film (12a; see FIG. 1) is then used as the mask to etch the silicon substrate 11 using an etching liquid constituted of a mixed liquid of fluoric acid and nitric acid, and whereby the x-ray mask 1 (see FIG. 1) is obtained. In this case, an electron beam (EB) resist is generally used as the resist, and the pattern is formed by means of an EB lithography.

For the x-ray membrane 12, a high transmittance to the x-ray, a high Youngis modulus of elasticity, a proper tensile stress, a resistance to x-ray radiation, the high transmittance within a visible light range, and the like are required. These characteristics will be described below. The transmittance to the x-ray is required during an exposure. The higher the transmittance is, the shorter the time required for the exposure. This is effective for improving throughput. The Youngis modulus of elasticity has an influence on strength of the film and deformation of an absorber pattern. The higher the Youngis modulus of elasticity is, the higher the film strength. This is effective for suppressing misalignment. The proper tensile stress is needed so that the film is self-supported. Since the x-ray membrane is irradiated with the x-ray during the exposure, it is necessary to not have damage due to this x-ray radiation, and thus the resistance to x-ray radiation is required. Since an alignment of the mask attached to an x-ray stepper and a wafer is accomplished by the use of a light source within the visible light range, high transmittance to an alignment light source (the visible light) is needed in order to achieve a highly accurate alignment. Furthermore, the film surface is required to be smooth. Surface smoothness is needed for highly accurate pattern formation on the absorber.

In order to satisfy these requirements, various materials and manufacturing methods have been studied. Since it is confirmed that the silicon carbide has damage due to the x-ray in the silicon nitride, the silicon carbide (SiC) and the diamond which have been heretofore used as the x-ray membrane, it may safely be said that the silicon carbide is the most promising material. However, since the SiC film generally has a polycrystalline structure, it has the film surface which is rougher than 6 nm (Ra: a center-line average roughness). To smooth the surface of this SiC film, an etch back method and a mechanical polishing method are carried out after the film formation. In etch back method, the rough SiC film is coated with the resist, and the thus obtained smooth resist surface is transferred onto SiC film by the dry etching. For mechanical polishing, a hard grain such as the diamond and alumina is used as an abrasive material so as to physically grind the unevenness on the surface of the SiC film. For example, according to Japanese Patent Publication No. 7-75219, a surface roughness of 20 nm or less is obtained by the etch back and the mechanical polishing. Although the definition of the surface roughness is not clear in this publication, this roughness is expected to be a maximum height (Rmax) and corresponds to about 2 nm or less in terms of Ra.

Recently, due to the advance in photolithography technique, introduction of the x-ray lithography has been performed later. At present, introduction from a generation of 1G bit-DRAM (design rule: 0.18 μm) is anticipated. Even if the x-ray lithography is introduced from 1G, the x-ray lithography is characterized in that it can be used through a plurality of generations up to 4G, 16G and 64G. Assuming that the x-ray lithography is used for 64G, the position precision required for the x-ray mask becomes severer, and is required to be as high as 10 nm. The inventor has already found that, in order to suppress such a position precision, it is effective to equalize an internal stress in an area in which a mask pattern is formed on the x-ray absorbing film (Japanese Patent Application No. 8-233402). As a result of a further study, the inventor has found that the surface roughness of the x-ray membrane has a sensitive influence on a stress distribution of the x-ray absorbing film formed on the x-ray membrane.

SUMMARY OF THE INVENTION

It is therefore an object of the present invention to provide an x-ray mask blank, in which a stress distribution of an x-ray absorbing film is suppressed, and an x-ray mask capable of a highly precise pattern transfer.

In accordance with first aspect of the present invention, there is provided an x-ray mask blank having at least an x-ray membrane on a substrate, wherein the x-ray membrane has a surface condition satisfying the following expression (1):

$$(Ra_{max} - Ra_{min})/(Ra_{max} + Ra_{min}) \leq 0.15 \quad (1)$$

where $Ra_{max}$ denotes a maximum value of Ra of a surface roughness (Ra: center-line average roughness) on a plurality of points within a predetermined area on the x-ray membrane, and $Ra_{min}$ denotes a minimum value of Ra of the surface roughness (Ra: center-line average roughness) on a plurality of points within a predetermined area on the x-ray membrane.

In accordance with a second aspect of the present invention, there is provided an x-ray mask blank according to the first aspect, wherein an average of the surface roughness (Ra: center-line average roughness) of a plurality of points within a predetermined area on the x-ray membrane is 1.0 nm or less.

In accordance with a third aspect of the present invention, there is provided an x-ray mask blank according to the first or second aspect, wherein the surface of the x-ray membrane is a generally uniformly polished surface.

In accordance with fourth aspect of the present invention, there is provided an x-ray mask blank according to any one of the first through third aspects, wherein the x-ray membrane comprises a silicon carbide film.

In accordance with a fifth aspect of the present invention, there is provided an x-ray mask having an x-ray absorbing film pattern on an x-ray membrane supported by a frame body, wherein the x-ray mask is manufactured by the use of the x-ray mask blank according to any one of the first through fourth aspects.

The inventor has studied the surface roughness of the x-ray membrane and the stress distribution of the x-ray absorbing film. As a result, it is found that the distribution of the surface roughness of the x-ray membrane causes the stress distribution of the absorbing film, and thus pattern position precision is deteriorated. The condition of the distribution of the surface roughness can be represented by the value of the left side of expression (1). Assuming that the value of the left side of expression (1) is defined as the value of the distribution of the surface roughness, if the value of the distribution of the surface roughness of the x-ray membrane exceeds 0.15 (15%), the stress distribution of the x-ray absorbing film is increased, which may deteriorate the pattern position precision. Therefore preferably the value of the distribution of the surface roughness of the x-ray membrane is 0.15 or less. More preferably, the value is 0.1 or less.

Since it is important for the x-ray absorbing film to control the stress distribution within the area in which a mask pattern is formed, it is preferable to similarly control the distribution of the surface roughness of the x-ray membrane within the area in which the mask pattern is formed. Furthermore, the average of the surface roughness (Ra: center-line average roughness) on a plurality of points within a predetermined area on the x-ray membrane is 1.0 nm or less, so that it is possible to suppress the distribution of the surface roughness of the x-ray membrane to some extent.

A silicon substrate or the like is used herein as the substrate. SiC, SiN, diamond or the like is used as the x-ray membrane. Preferably, SiC is used in view of its resistance to x-ray radiation.

Moreover, in order to suppress variations in the surface roughness of the x-ray membrane, it is effective to uniformly polish the substrate having the x-ray membrane. For this purpose, the substrate having the x-ray membrane is affixed to a substrate fixing, jig, and a load to a polishing means, such as an abrasive cloth, is applied to uniformly the substrate fixing jig so as to polish the substrate. Preferably, a method of affixing the substrate having the x-ray membrane to the substrate fixing jig is the method of affixing the substrate to an SUS jig through water (a water affixing method). Methods of affixing the substrate to the substrate fixing jig by the use of a wax, an adhesive tape or the like is not preferable, because the relatively thin substrate such as the x-ray mask blank is prone to a deformation while being affixed and thus variations in polishing result when the substrate is polished. On the other hand, if the substrate is affixed to the substrate fixing jig by the use of the water affixing method, the deformation of the substrate can be avoided when the substrate is affixed, and thus uniform polishing is possible. More specifically, when SiC is used as the x-ray membrane, it is preferable to apply a load of about 50-400 g/cm². Since SiC is a hard film, it is preferable that the diamonds is used as an abrasive material. It should be noted that a method as described below is used in order to prevent a scratch from being made on the surface. That is, the surface is polished by the use of a diamond whose average particle diameter is as relatively small as about 0.05-0.3 µm or a diamond whose average particle diameter is larger than the former (about 0.3-0.6 µm), and then the surface is polished by the use of colloidal silica. Moreover, when a colloidal silica is used without the use of the diamond, hydrogen peroxide is contained in the colloidal silica, whereby it is possible to obtain a surface which is flat and not scratched.

The x-ray mask blank of the present invention may be the one in which the film is constituted by an etching stop layer, an adhesive layer, a reflection preventing layer and a conductive layer disposed between the x-ray membrane and the x-ray absorbing film. Alternatively, the x-ray mask blank may also be one in which a mask layer, a protective layer and a conductive layer are disposed on the x-ray absorbing film.

BRIEF DESCRIPTION OF THE DRAWINGS

FIG. 4 is a table generally showing a distribution value of a surface roughness of an x-ray membrane, an average of the surface roughness of the x-ray membrane, a stress distribution of an x-ray absorbing film and a position precision of an x-ray absorbing film pattern of the embodiments and a comparison example.

DESCRIPTION OF THE PREFERRED EMBODIMENTS

An x-ray mask blank and an x-ray mask of embodiments of the present invention will be described with reference to FIG. 3.

[Embodiment 1]

[Formation of X-ray Membrane]

First, a silicon carbide film is formed as an x-ray membrane 12 on both the surfaces of a silicon substrate 11. The silicon substrate of 4 in. φ in size, of 2 mm in thickness and of a crystalline orientation of (100) is used as the silicon substrate 11. The silicon carbide film as the x-ray membrane is also formed to 2.1 µm in thickness by a CVD process by the use of dichlorosilane and acetylene. Next, the surface of the x-ray membrane 12 is smoothed by a mechanical polishing. The mechanical polishing is performed in the following manner. First, the rear surface of the substrate on which the x-ray membrane 12 is formed is affixed to a stainless (SUS) jig by a water affixing method, and the film surface is brought into contact with a solidifying polymer type soft abrasive cloth in which a diamond particle of an average particle diameter of ⅛ µm (0.05-0.35 µm in diameter: Nihon Engis) is dispersed. Then, a load of 200 g/cm$^2$ is applied to the jig while the jig is rotated at 60 rpm, whereby the surface is polished for five minutes.

A surface roughness (Ra) of 100 points within a range of 30×30 mm of the center of the substrate on the thus obtained surface is measured by an atomic force microscope, and a value (a distribution value of the surface roughness) of the left side of expression (1) is determined from a maximum value of Ra and a minimum value of Ra. The resulting value is 0.05, and the average of the surface roughness is 0.35 nm. At this time, a scratch on the surface is 0.2 µm or less.

[Formation of X-ray Absorbing Film]

Figure 1:
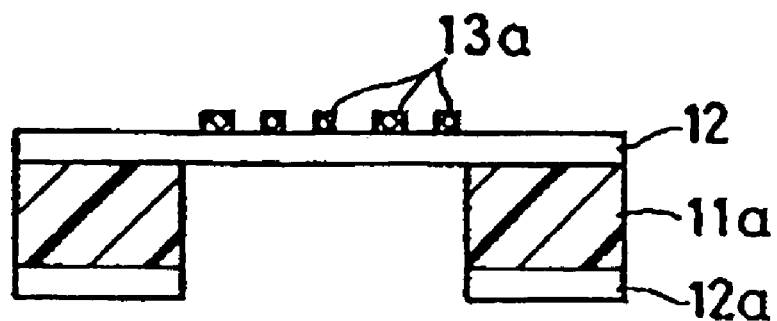
FIG. 1 is a cross sectional view for describing a structure of an x-ray mask.
Figure 2:
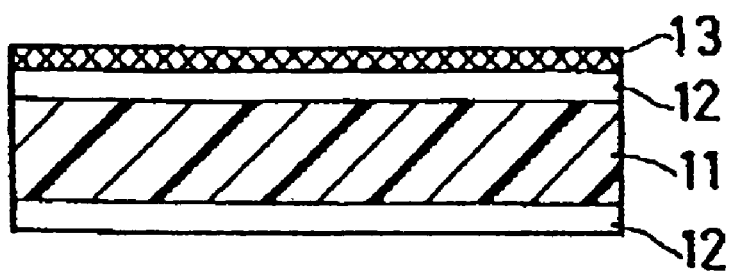
FIG. 2 is a cross sectional view for describing the structure of an x-ray mask blank.
Figure 3A:
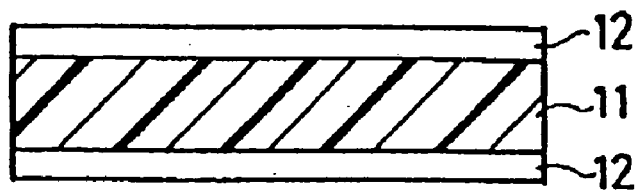
FIG. 3 is an illustration of a method of manufacturing the x-ray mask according to embodiments of the present invention.
Figure 3B:
Figure 3B:
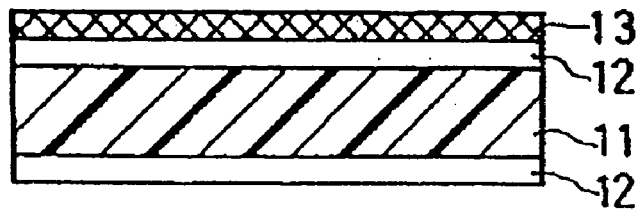

Next, as shown in FIG. 3(B), an x-ray absorbing film 13 of tantalum and boron is formed to 0.5 µm in thickness on the x-ray membrane 12 by a DC magnetron sputtering process. A sintered body containing tantalum and boron in an atomicity ratio (Ta/B) of 8 to 2 is used as a sputter target. The sputter gas is Xe, RF power density is set at 6.5 W/cm$^2$ and sputter gas pressure is set at 0.35 Pa. Next, this substrate is annealed at 250° C. for two hours in a nitrogen atmosphere to obtain the x-ray absorbing film 13 of a low stress of 10 MPa or less. At this time, a stress having the x-ray absorbing film is measured by a highly precise stress measuring unit (WS-5000: NTT Advance Technology) and is within the same range as the above-described range in which the surface roughness of the x-ray membrane is measured. As a result, the stress is 0±4 MPa.

[Formation of Etching Mask Layer]

Figure 3C:
Figure 3C:
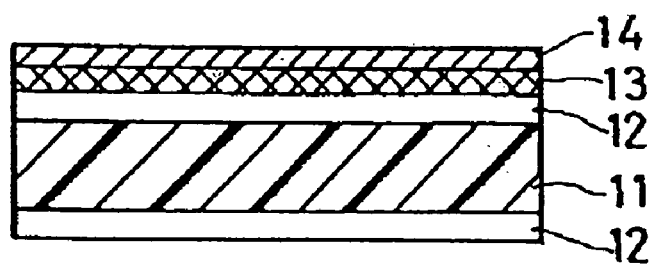
Figure 3D:
Figure 3D:
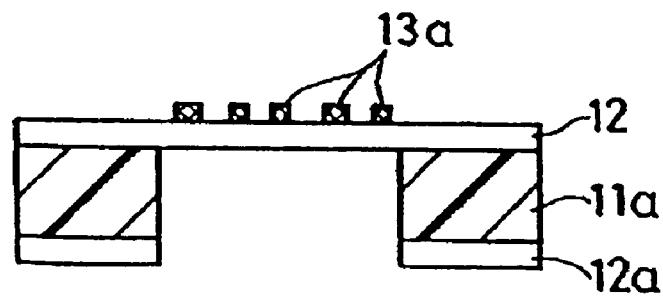

Next, as shown in FIG. 3(C), a chromium film containing chromium carbide is formed as an etching mask layer 14 on the x-ray absorbing film 13 by an RF magnetron sputtering process so that it is 0.05 µm in thickness. Cr is used as the sputter target, the sputter gas has 7% of methane mixed into Ar, the RF power density is set at 6.5 W/cm$^2$ and the sputter gas pressure is set at 1.2 Pa. An etching mask layer having a low stress of 100 MPa or less is then obtained.

The product obtained in this step is also used as one type of the x-ray mask blank.

[Formation of X-ray Absorbing Film Pattern and Formation of Frame Body]

A resist film on which a desired pattern is formed is arranged on an x-ray mask blank 2. This pattern is used as the mask so as to perform a dry etching, whereby the x-ray absorbing film pattern is formed. Then, a center area, formed on the rear surface and to be a window area of the x-ray membrane 12, is removed by a reactive ion etching (RIE) using CF$_4$ as the etching gas. The remaining film 12a is then used as the mask so as to etch the silicon substrate 11 using an etching liquid of a mixed liquid of fluoric acid and nitric acid, whereby an x-ray silicon frame body 11a is formed, and the x-ray mask is thus obtained. In this case, an electron beam (EB) resist is generally used as the resist, and the pattern is formed by means of an EB lithography.

A misalignment of the x-ray absorbing film pattern (an actual shift of the pattern with respect to a design pattern) of the x-ray mask manufactured by this embodiment is evaluated by a coordinate measuring device. As a result, the position precision is 18 nm which is sufficient.

[Embodiment 2]

[Formation of X-ray Membrane]

First, the silicon carbide film is formed as the x-ray membrane 12 on both surfaces of the silicon substrate 11. A silicon substrate of 4 in. φ in size, of 2 mm in thickness and of the crystalline orientation of (100) is used as the silicon substrate 11. The silicon carbide film as the x-ray membrane is also formed to 2.1 µm in thickness by the CVD process by the use of dichlorosilane and acetylene. Next, the surface of the x-ray membrane 12 is smoothed by the mechanical polishing. The mechanical polishing is performed in the following manner. First, the rear surface of the substrate on which the x-ray membrane 12 is formed is affixed to the stainless (SUS) jig, and the film surface is brought into contact with the solidifying polymer type soft abrasive cloth in which a diamond particles of an average particle diameter of ¼ µm (0.1-0.6 µm in diameter: Nihon Engis) is dispersed. Then, a load of 200 g/cm$^2$ is applied to the jig while the jig is rotated at 60 rpm. The surface is polished for five minutes, so that a surface roughness of 1 nm or less Ra is obtained. However, a scratch of 0.2 µm or more is on the surface of the thus obtained film. Therefore, the rear surface of the substrate is fixed to the SUS jig, and the substrate is brought into contact with a suede type (nonwoven fabric type) abrasive cloth in which colloidal silica (its particle diameter: 60-80 nm) is dispersed. Then, a load of 180 g/cm$^2$ is applied to the jig while the jig is rotated at 60 rpm. The surface is polished for five minutes, so that the scratch is reduced to 0.2 µm or less on the surface. The distribution of the surface roughness of the thus obtained x-ray membrane is determined in the same manner as for. The first embodiment, the distribution is 0.08 and the average of the surface roughness is 0.70 nm. The thus obtained product is also used as one type of x-ray mask blank.

[Formation of X-ray Absorbing Film]

Next, as shown in FIG. 3(B), the x-ray absorbing film 13 of tantalum and boron is formed to 0.5 µm in thickness on the x-ray membrane 12 by the DC magnetron sputtering process. The sintered body containing tantalum and boron in the atomicity ratio (Ta/B) of 8 to 2 is used as the sputter target. The sputter gas is Xe, the RF power density is set at 6.5 W/cm$^2$, and the sputter gas pressure is set at 0.35 Pa. Next, this substrate is annealed at 250° C. for two hours in the nitrogen atmosphere so as to thereby obtain the x-ray absorbing film 13 of a low stress of 10 MPa or less. The stress distribution on the surface of this film is determined in the same manner as described above, and has a stress distribution of 0±5 MPa. The product obtained in this step is also used as one type of x-ray mask blank.

[Formation of Etching Mask Layer]

Next, as shown in FIG. 3(C), the chromium film containing chromium carbide is formed as the etching mask layer 14 on the x-ray absorbing film 13 by a RF magnetron sputtering process so that it may be 0.05 μm in thickness. Cr is used as the sputter target, the sputter gas has 7% methane mixed into Ar, the RF power density is set at 6.5 W/cm², and the sputter gas pressure is set at 1.2 Pa, thereby obtaining the etching mask layer of the low stress of 100 MPa or less. The product obtained in this step is also dealt as one type of the x-ray mask blank.

[Formation of X-ray Absorbing Film Pattern and Formation of Frame Body]

The resist film on which a desired pattern is formed is arranged on the x-ray mask blank 2. This pattern is used as the mask so as to perform the dry etching, whereby the x-ray absorbing film pattern is formed. Then, the center area formed on the rear surface, to be the window area of the x-ray membrane 12, is removed by reactive ion etching (RIE) using 4-carbonfluoride (CF₄) as the etching gas. The remaining film 12a is then used as the mask to etch the silicon substrate 11 with the etching liquid constituted of the mixed liquid of fluoric acid and nitric acid, whereby the x-ray silicon frame body 11a is formed, and the x-ray mask is thus obtained (see FIG. 3(D)). In this case, an electron beam (EB) resist is generally used as the resist, and the pattern is formed by means of EB lithography.

The misalignment of the x-ray absorbing film pattern of the x-ray mask manufactured by this embodiment was evaluated by the coordinate measuring device. As a result, the position precision was 15 nm which is sufficient.

[Embodiment 3]

This embodiment is the same as the first and second embodiments except that the following mechanochemical polishing is performed as the step of polishing the silicon carbide film which is the x-ray membrane 12 in the step of forming the x-ray membrane 12 in the first and second embodiments.

The mechanochemical polishing of this embodiment is carried out in the following manner. The substrate is brought into contact with a solidifying polymer type abrasive cloth in which colloidal silica (its particle diameter: 60-80 nm) is dispersed, and then a load of 180 g/cm² is applied to the substrate while the substrate is rotated at 60 rpm. The surface is polished for ten minutes. At this time, 30% of $H_2O_2$ is added into colloidal slurry, and the pH of the solvent medium is changed into a weak alkali (8.5). In such a manner, a catalytic action gets active, and thus polishing speed can be increased, and the surface smoothed.

In this embodiment, after the polishing of the x-ray membrane is completed, the distribution of the surface roughness of the x-ray membrane is determined in the same manner as the first embodiment. As a result, the distribution is 0.12, and the average of the surface roughness is 0.85 nm.

After forming the x-ray absorbing film, the stress distribution of the x-ray absorbing film is determined in the same manner as the first embodiment. The resulting stress distribution is 0±6 MPa.

Furthermore, the misalignment of the x-ray absorbing film pattern of the x-ray mask manufactured by this embodiment is evaluated by the coordinate measuring device. The position precision is 20 nm which satisfies the required position precision.

COMPARISON EXAMPLE

This comparison example is the same as the first embodiment, except the method of fixing the rear surface of the substrate on which the x-ray membrane 12 is formed to the stainless (SUS) jig in the step of polishing the x-ray membrane 12 in the above-mentioned first embodiment. Unlike the first embodiment (the water affixing method is used in the first embodiment), the rear surface is fixed by the use of a wax in the comparison example.

In this comparison example, after the polishing of the x-ray membrane is completed, the distribution of the surface roughness of the x-ray membrane is determined in the same manner as the first embodiment. The distribution is 0.25, and the average of the surface roughness is 0.43 nm.

After forming the x-ray absorbing film, the stress distribution of the x-ray absorbing film is determined in the same manner as the first embodiment. The resulting stress distribution is 0±15 MPa.

Furthermore, the misalignment of the x-ray absorbing film pattern of the x-ray mask manufactured by this embodiment is evaluated by the coordinate measuring device. The position precision is 35 nm which cannot satisfy the required position precision.

FIG. 4 is a table generally showing the distribution value of the surface roughness of the x-ray membrane, the average of the surface roughness of the x-ray membrane, the stress distribution of the x-ray absorbing film and the position precision of the x-ray absorbing film pattern of the above embodiments and the comparison example. Although a compound of Ta and B (Ta/B=8/2) is used as the x-ray absorbing film in the above-mentioned embodiments, this may be replaced by a metal Ta, an amorphous material containing Ta and tantalum boride, having a composition other than $Ta_4B$, for example.

Additionally, a structure of the x-ray mask blank is not only the structure of the embodiments but also the so-called membraned structure in which the x-ray membrane is formed on the substrate and the center is then removed from the rear surface of the substrate, so as to form the frame body whereby the x-ray membrane is laminated on this frame body. Accordingly, it may safely be said that all the intermediate products in the step of manufacturing the x-ray mask are x-ray mask blanks.

Furthermore, an adhesive layer, a reflection preventing film or the like may be disposed between the x-ray membrane and the x-ray absorbing film. In this case, after forming these films, a defect is checked on the surface thereof.

What is claimed is:

1. An x-ray mask blank having at least an x-ray membrane on a substrate, wherein said x-ray membrane has a surface condition satisfying the following expression (1):

$$(Ra_{max} - Ra_{min})/(Ra_{max} + Ra_{min}) \leq 0.15 \qquad (1)$$

where $Ra_{max}$ denotes a maximum value of Ra of a surface roughness (Ra: center-line average roughness) on a plurality of points within a predetermined area on said x-ray membrane, and $Ra_{min}$ denotes a minimum value of Ra of the surface roughness (Ra: center-line average roughness) on a plurality of points within a predetermined area on said x-ray membrane.

2. The x-ray mask blank according to claim 1, wherein an average of the surface roughness (Ra: center-line average roughness) on a plurality of points within a predetermined area on said x-ray membrane is 1.0 nm or less.

3. The x-ray mask blank according to claim 2, wherein the surface of said x-ray membrane is a generally uniformly polished surface.

4. The x-ray mask blank according to claim 1, wherein said x-ray membrane comprises a silicon carbide film.

5. An x-ray mask having an x-ray absorbing film pattern on an x-ray membrane supported by a frame body, wherein said x-ray mask has a surface condition satisfying the following expression:

$$(Ra_{max} - Ra_{min})/(Ra_{max} + Ra_{min}) \leq 0.15$$

where $Ra_{max}$ denotes a maximum value of Ra of a surface roughness (Ra: center-line average roughness) on a plurality of points within a predetermined area on said x-ray membrane, and $Ra_{min}$ denotes a minimum value of Ra of the surface roughness (Ra: center-line average roughness) on a plurality of points within a predetermined area on said x-ray membrane.

* * * * *